United States Patent
Huang et al.

(10) Patent No.: US 8,536,946 B2
(45) Date of Patent: Sep. 17, 2013

(54) MULTI-INPUT OPERATIONAL AMPLIFIER AND OUTPUT VOLTAGE COMPENSATION METHOD THEREOF

(75) Inventors: Ju-Lin Huang, Hsinchu County (TW); Chun-Yung Cho, Hsinchu County (TW); Yu-Shao Liu, Kaohsiung (TW)

(73) Assignee: Novatek Microelectronics Corp., Hsinchu (TW)

( * ) Notice: Subject to any disclaimer, the term of this patent is extended or adjusted under 35 U.S.C. 154(b) by 71 days.

(21) Appl. No.: 13/275,319

(22) Filed: Oct. 18, 2011

(65) Prior Publication Data
US 2013/0002353 A1      Jan. 3, 2013

(30) Foreign Application Priority Data
Jun. 29, 2011   (TW) .............................. 100122899 A

(51) Int. Cl.
*H03F 3/45*       (2006.01)
(52) U.S. Cl.
USPC ........................................................ 330/253
(58) Field of Classification Search
USPC ................................................ 330/253, 254
See application file for complete search history.

(56) References Cited

U.S. PATENT DOCUMENTS

| | | | | |
|---|---|---|---|---|
| 6,445,248 | B1 * | 9/2002 | Gilbert .......................... | 330/254 |
| 8,098,096 | B2 * | 1/2012 | Traub ............................ | 330/253 |
| 8,344,803 | B2 * | 1/2013 | Moldsvor et al. ............. | 330/254 |

* cited by examiner

*Primary Examiner* — Khanh V Nguyen
(74) *Attorney, Agent, or Firm* — Jianq Chyun IP Office

(57) ABSTRACT

An output error compensation method adapted to a multi-input operational amplifier is disclosed. The output error compensation method includes following steps. A plurality of original transconductances of a plurality of differential pairs is obtained regarding a specific combination of input voltages received by the differential pairs. Transconductance differences of a plurality of adjustable differential pairs among the differential pairs are obtained according to the original transconductances. Adjusted transconductance of the adjustable differential pairs are obtained according to the original transconductances and the transconductance differences. Transconductances of the adjustable differential pairs are respectively adjusted according to the adjusted transconductances, so that an output voltage can match an expected value when each of a plurality of combinations of the input voltages is received.

17 Claims, 4 Drawing Sheets

MULTI-INPUT OPERATIONAL AMPLIFIER AND OUTPUT VOLTAGE COMPENSATION METHOD THEREOF

CROSS-REFERENCE TO RELATED APPLICATION

This application claims the priority benefit of Taiwan application serial no. 100122899, filed on Jun. 29, 2011. The entirety of the above-mentioned patent application is hereby incorporated by reference herein and made a part of this specification.

BACKGROUND OF THE INVENTION

1. Field of the Invention

The invention generally relates to a multi-input operational amplifier, and more particularly, to an output error compensation method of a multi-input operational amplifier.

2. Description of Related Art

In order to reduce the layout areas, many display driver integrated circuits (ICs) adopt multi-input operational amplifiers as their output buffers. A multi-input operational amplifier can generate a combined output voltage by interpolating several different voltages.

FIG. 1 is an internal circuit diagram of an input stage of a conventional multi-input operational amplifier. Referring to FIG. 1, the input stage of the multi-input operational amplifier has K differential pairs, wherein K is a positive integer greater than 1 (for example, 4). An input terminal of each of the differential pairs is coupled to an output terminal of the multi-input operational amplifier for receiving an output voltage VO, and the other input terminals IN1-INK of the differential pairs respectively receive input voltages V1-VK. Each of the differential pairs generates a differential signal V(+) and V(−) according to the received input voltage, such that a subsequent output stage circuit can generate the output voltage VO.

Assuming that the input voltages V1-VK contain only two voltages VH and VL, when the input voltages V1-VK are respectively VH, VL, VL, . . . , and VL, the output voltage VO at the output terminal of the multi-input operational amplifier 100 is equal to VL+(VH−VL)/K. Accordingly, the relationship between the input voltages V1-VK and the output voltage VO is obtained as shown in following table 1:

TABLE 1

| Input Voltage Combination Type | V1 | V2 | V3 | ... | VK | VO |
|---|---|---|---|---|---|---|
| 1 | VL | VL | VL | ... | VL | VL |
| 2 | VH | VL | VL | ... | VL | $VL + \frac{1}{K}(VH - VL)$ |
| 3 | VH | VH | VL | ... | VL | $VL + \frac{2}{K}(VH - VL)$ |
| 4 | VH | VH | VH | ... | VL | $VL + \frac{3}{K}(VH - VL)$ |
| 5 | VH | VH | VH | ... | VH | VH |

Theoretically, the output voltage VO can also be expressed in following expression 1:

$$VO = \frac{(Ngm_H VH + Ngm_L VL)}{(Ngm_H + Mgm_L)} \quad (1)$$

wherein N and M are respectively the numbers of the voltages VL and VH among the input voltages V1-VK received by the input terminals IN1-INK, and $gm_H$ and $gm_L$ are respectively the transconductances when the input voltages V1-VK received by the differential pairs are at the voltage levels VL and VH.

It can be understood based on foregoing expression (1) that the output voltage VO of the multi-input operational amplifier in FIG. 1 can be as ideal as that shown in table 1 only when $gm_H$ is equal to $gm_L$. However, according to the relationship between transconductance and the input voltage difference±V on two input terminals of a differential pair (as shown in FIG. 2), the transconductance changes with the input voltage difference V. Thus, $gm_H$ and $gm_L$ may not be equal to each other. The difference between $gm_H$ and $gm_L$ produces an error in the output voltage VO of the multi-input operational amplifier 100 with a specific combination of the input voltages V1-VK, and accordingly the output voltage VO cannot be as ideal as that shown in foregoing table 1. For example, when K=4, the actual value of the output voltage VO with the input voltage combination type 2 (i.e., V1-V4 are VH, VL, VL, and VL) is lower than the ideal value $$VL + \frac{1}{4}(VH - VL)$$

thereof, and the actual value of the output voltage VO with the input voltage combination type 4 (i.e., V1-V4 are VH, VH, VH, and VL) are higher than the ideal value $$VL + \frac{3}{4}(VH - VL)$$

thereof.

SUMMARY OF THE INVENTION

Accordingly, the invention is directed to an output error compensation method adapted to a multi-input operational amplifier, in which an output error generated by the multi-input operational amplifier with a specific input voltage combination can be compensated.

The invention is also directed to a multi-input operational amplifier in which output errors generated with different input voltages are effectively compensated.

One embodiment provides an output error compensation method adapted to a multi-input operational amplifier. The multi-input operational amplifier has a plurality of differential pairs. Each of the differential pairs has a first input terminal coupled to an output terminal of the multi-input operational amplifier and a second input terminal for receiving an input voltage, wherein the input voltage is set at either of a plurality of levels. In the output error compensation method, following steps (i)-(iv) are executed regarding a specific combination of the input voltages received by the second input terminals of the differential pairs. In step (i), a plurality of original transconductances of the differential pairs is obtained. In step (ii), transconductance differences of a plurality of adjustable differential pairs among the differential pairs are obtained according to the original transconductances. In step (iii), adjusted transconductances of the adjustable differential pairs are obtained according to the transconductance differences and the original transconductances. In step (iv), transconductances of the adjustable differential pairs are respectively adjusted according to the adjusted transconductances, so that an output voltage can match an expected value when each of a plurality of combinations of the input voltages is received.

Another embodiment provides a multi-input operational amplifier including a plurality of differential pairs. Each of the differential pairs has an input terminal coupled to an output terminal of the multi-input operational amplifier and another input terminal for receiving an input voltage, wherein the input voltage is set at either of a plurality of levels. A plurality of differential pairs among the differential pairs have adjusted transconductances, and compared to other differential pairs among the differential pairs, they have transconductance differences when the same input voltages are received, so that an output voltage can match an expected value when one of a plurality of combinations of the input voltages of the differential pairs is received.

As described above, in the invention, the transconductances of a plurality of differential pairs in the multi-input operational amplifier when input voltages are received are calculated, and the transconductance of at least one of the differential pairs is adjusted according to the differences between the transconductances, so that an output error of the multi-input operational amplifier can be compensated, and accordingly the accuracy in the output of the multi-input operational amplifier can be improved.

These and other exemplary embodiments, features, aspects, and advantages of the invention will be described and become more apparent from the detailed description of exemplary embodiments when read in conjunction with accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
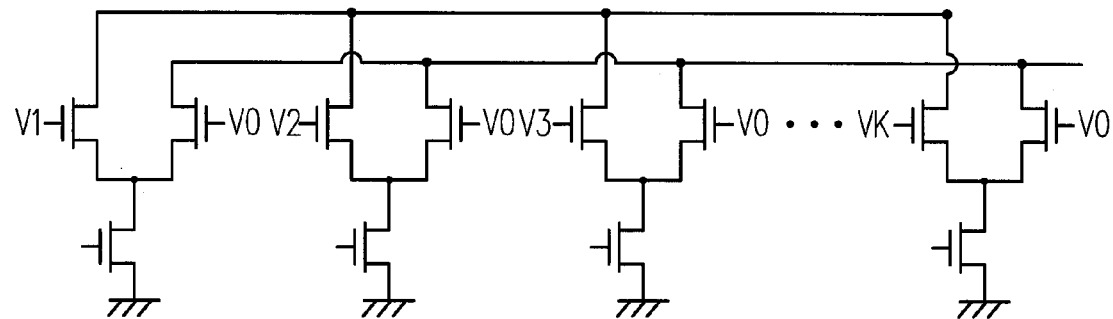
FIG. 1 is a diagram of a conventional multi-input operational amplifier 100.
Figure 2:
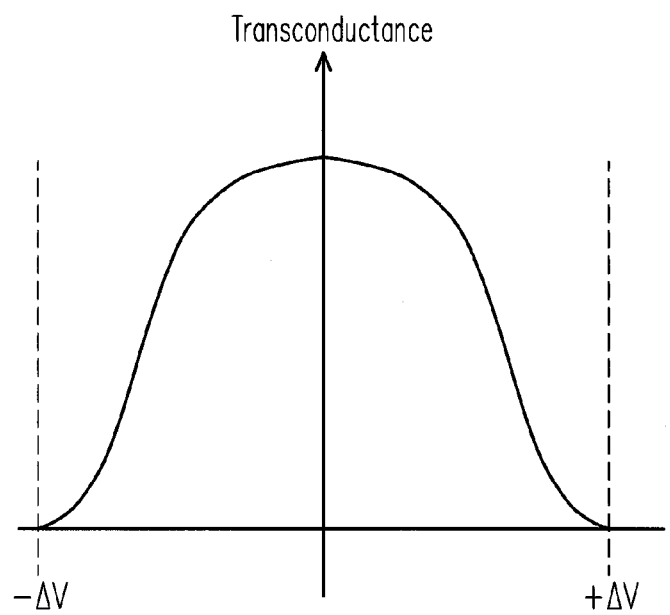
FIG. 2 is a graph illustrating the relationship between transconductance and input voltage difference±V.

Reference will now be made in detail to the present preferred embodiments of the invention, examples of which are illustrated in the accompanying drawings. Wherever possible, the same reference numbers are used in the drawings and the description to refer to the same or like parts.

Below, an output error compensation method adapted to a multi-input operational amplifier will be described with reference to exemplary embodiments of the invention so that those having ordinary knowledge in the art can understand and implement the invention accordingly.

Figure 3:
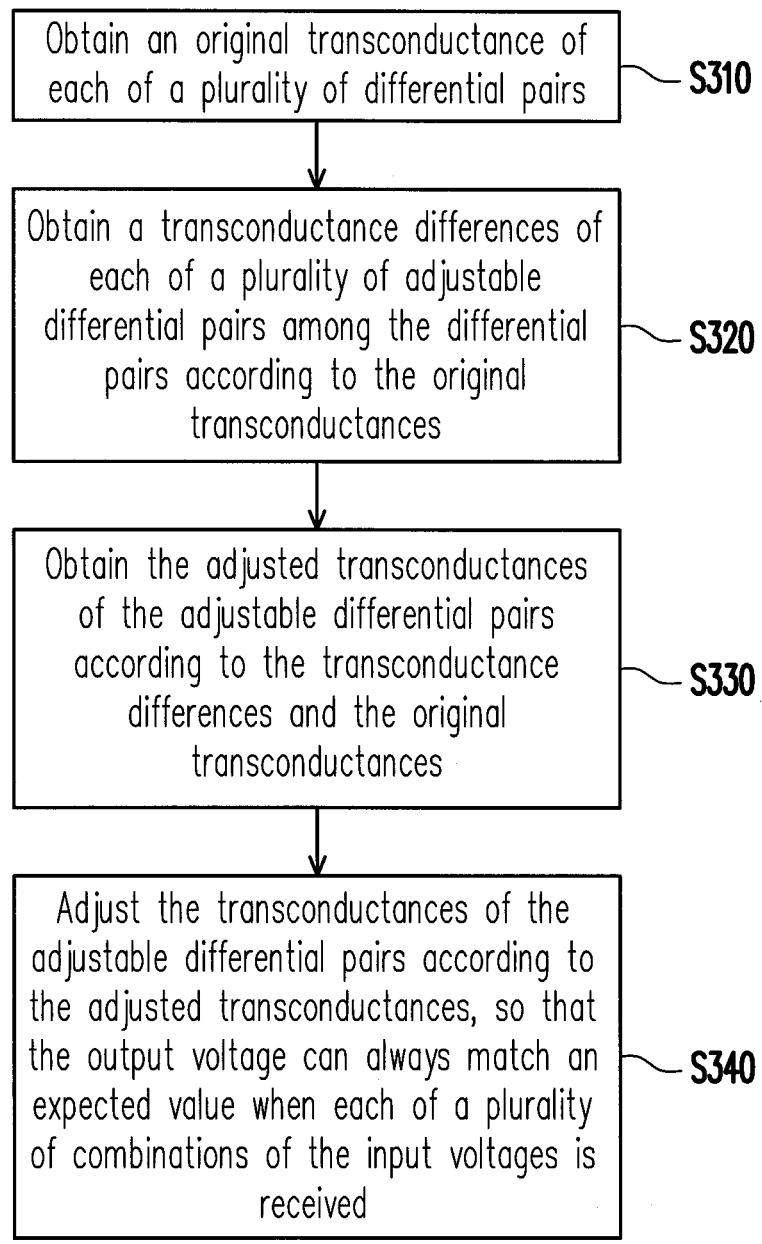
FIG. 3 is a flowchart of an output error compensation method according to an embodiment.
Figure 4:
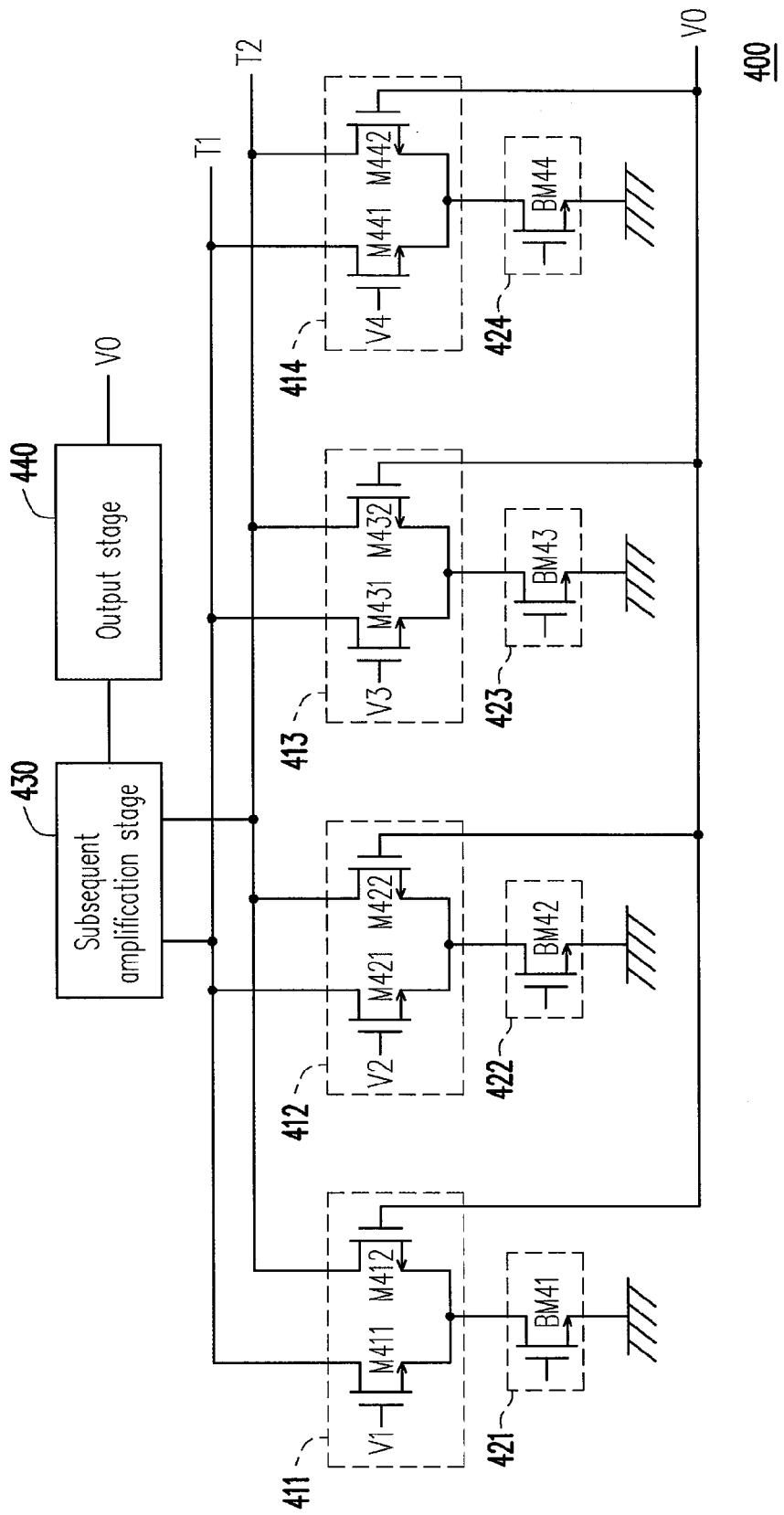
FIG. 4 is a diagram of a multi-input operational amplifier 400 according to another embodiment.

FIG. 3 is a flowchart of an output error compensation method according to an embodiment. The output error compensation method 300 is adapted to the multi-input operational amplifier illustrated in FIG. 1. FIG. 4 is a diagram of a multi-input operational amplifier 400 according to another embodiment. Please refer to both FIG. 3 and FIG. 4 regarding following descriptions.

It should be noted that in following description, the output error compensation method 300 is applied to the 4-input operational amplifier 400 illustrated in FIG. 4. However, the output error compensation method 300 can be applied to multi-input operational amplifiers having different numbers of inputs. The multi-input operational amplifier has a plurality of differential pairs, and each of the differential pairs has a first input terminal and a second input terminal, wherein the first input terminal is coupled to an output terminal of the multi-input operational amplifier, the second input terminal is configured to receive an input voltage, and the input voltage is set at either of a plurality of levels.

Please refer to FIG. 4 for the detailed structure of the 4-input operational amplifier 400. The multi-input operational amplifier 400 includes a plurality of differential pairs 411-414 and bias current generators 421-424. Input terminals of the differential pairs 411-414 are all coupled to an output terminal of the multi-input operational amplifier 400 for receiving an output voltage VO. The input terminals of the differential pairs 411-414 not coupled to the output terminal of the multi-input operational amplifier 400 respectively receive input voltages V1-V4.

The differential pair 411 includes transistors M411 and M412, the differential pair 412 includes transistors M421 and M422, the differential pair 413 includes transistors M431 and M432, and the differential pair 414 includes transistors M441 and M442. Taking the differential pair 411 as an example, the transistor M411 and the transistor M412 respectively have a first terminal, a second terminal, and a control terminal. The first terminals of the transistor M411 and the transistor M412 are coupled with each other, the control terminal of the transistor M411 receives the input voltage V1, and the control terminal of the transistor M412 is coupled to the output terminal of the multi-input operational amplifier 400 for receiving the output voltage VO. Besides, the second terminals of the transistors M411 and M412 are respectively coupled to nodes T1 and T2. The nodes T1 and T2 are coupled to subsequent amplification stage 430 and output stage 440 (direct connection is exemplarily shown, but the coupling can be by indirect connection).

The bias current generators 421-424 are respectively coupled to the differential pairs 411-414 to provide a plurality of bias currents to the differential pairs 411-414. In the present embodiment, the bias current generator 421 is coupled to the first terminals of the transistors M411 and M412 that are coupled with each other, the bias current generator 422 is coupled to the first terminals of the transistors M421 and M422 that are coupled with each other, the bias current generator 423 is coupled to the first terminals of the transistors M431 and M432 that are coupled with each other, and the bias current generator 424 is coupled to the first terminals of the transistors M441 and M442 that are coupled with each other. In the present embodiment, the bias current generators 421-424 are respectively composed of transistors BM41-BM44.

When the transconductances of the differential pairs 411-414 in the multi-input operational amplifier 400 are adjusted, steps S310-S340 illustrated in FIG. 3 are executed regarding a specific level combination of the input voltages V1-V4 received by the input terminals of the differential pairs 411-

414. Herein the specific level combination results in an error in the output voltage VO. For example, the specific level combination is the combination type 2 (i.e., the input voltages V1-V4 are VH, VL, VL, and VL) or the combination type 4 (i.e., the input voltages V1-V4 are VH, VH, VH, and VL) in foregoing table 1. In following descriptions, the specific level combination is assumed to be the combination type 2. However, following description is also applicable when the specific level combination is the combination type 4.

In step S310, original transconductances of the differential pairs 411-414 are obtained. Since the specific level combination is the combination type 2, the original transconductances of the differential pairs 411-414 are respectively $gm_H$, $gm_L$, $gm_L$, and $gm_L$. Herein $gm_H$ is the original transconductance of the differential pair 411 when the specific combination of the input voltages V1-V4 is received, and $gm_L$ is the original transconductance of each of the differential pairs 412-414 when the specific combination of the input voltages V1-V4 is received.

The original transconductances can be calculated through circuit simulation or by directly measuring the physical differential pairs 411-414. For example, the output voltage VO generated by the output terminal of the multi-input operational amplifier 400 is directly input to an input terminals of the differential pairs 411-414 (i.e., the gates of the transistors M412-M442), and the specific combination (VH, VL, VL, VL) of the input voltages V1-V4 are respectively supplied to another input terminals of the differential pairs 411-414. Or, the original transconductance of a single differential pair can be calculated by directly supplying a specific voltage difference $\Delta V$ between two input terminals of each of the differential pairs 411-414. The input voltages V1-V4 of the combination type 2 are respectively VH, VL, VL, and VL, and the output voltage VO is assumed to be $$VL + \frac{1}{4}(VH - VL).$$

Thus, differential voltages $\Delta V_1 \sim \Delta V_4$ can be respectively supplied to the differential pairs 411-414 (wherein $$\Delta V_1 = \frac{3}{4}(V_H - V_L),$$

and $$\Delta V_2 = \Delta V_3 = \Delta V_4 = \frac{-1}{4}(V_H - V_L))$$

to calculate the original transconductances $gm_H$, $gm_L$, $gm_L$, and $gm_L$ thereof.

Next, in step S320, transconductance differences of a plurality of adjustable differential pairs among the differential pairs 411-414 are obtained according to the original transconductances obtained in step S310. Herein not the transconductance differences of all the differential pairs 411-414 are adjusted. Instead, the transconductance differences of several (for example, 2) differential pairs are adjusted.

In the present embodiment, the transconductances of the differential pairs 412 and 413 are adjusted by using a transconductance difference $\Delta gm$. Besides, the transconductance differences of the differential pair 412 and 413 are set to be equal to each other. In other words, the transconductances of the differential pairs 411-414 after the adjustment is done are respectively $gm_H$, $gm_L-gm$, $gm_L-gm$, and $gm_L$. In an embodiment, the transconductance difference—gm is equal to $-3/2(gm_L-gm_H)$. Below, the deduction of the transconductance difference will be explained in detail.

When the input voltages V1-V4 received by the differential pairs 411-414 are respectively VH, VL, VL, and VL, ideally, the output voltage VO should be equal to VL+(VH-VL)/4. Namely, the input voltage differences V1-V4 received by the differential pairs 411-414 are respectively expressed in following expression (2):

$$\Delta V1 = \frac{3}{4}(VH - VL) \qquad (2)$$

$$\Delta V2 = \Delta V3 = \Delta V4 = -\frac{1}{4}(VH - VL)$$

Accordingly, the currents i(+) and i(−) through the nodes T2 and T1 can be expressed in following expression (3):

$$i(+) = \frac{1}{2}gm_H \Delta V1 + \frac{1}{2}(gm_L - \Delta gm)\Delta V3 + \qquad (3)$$

$$\frac{1}{2}(gm_L - \Delta gm)\Delta V3 + \frac{1}{2}gm_L \Delta V4$$

$$= \frac{1}{2}(VH - VL)$$

$$\left[\frac{3}{4}gm_H - \frac{1}{4}(gm_L - \Delta gm) - \frac{1}{4}(gm_L - \Delta gm) - \frac{1}{4}gm_L\right]$$

$$i(-) = -\frac{1}{2}gm_H \Delta V1 - \frac{1}{2}(gm_L - \Delta gm)\Delta V2 -$$

$$\frac{1}{2}(gm_L - \Delta gm)\Delta V3 - \frac{1}{2}gm_L \Delta V4$$

$$= -\frac{1}{2}(VH - VL)$$

$$\left[\frac{3}{4}gm_H - \frac{1}{4}(gm_L - \Delta gm) - \frac{1}{4}(gm_L - \Delta gm) - \frac{1}{4}gm_L\right]$$

To make the output voltage VO to be equal to VL+(VH−VL)/4, both the currents i(+) and i(−) in foregoing expression (3) should be 0. Following expression (4) is obtained from foregoing expression (3) under aforementioned condition:

$$\Delta gm = \frac{3}{2}(gm_L - gm_H) \qquad (4)$$

Thereafter, in step S330, the adjusted transconductances of the adjustable differential pairs are obtained according to the transconductance differences and the original transconductances. As described above, the adjusted transconductances of the differential pairs 411-414 are respectively $gm_H$, gmL'=$gm_L$-gm, gmL'=$gm_L$-gm, and $gm_L$ (i.e., $gm_H$, 1/2$gm_L$, 1/2$gm_L$, and $gm_L$). In other words, if the same input voltage VL is received, the adjusted transconductances of the specific differential pairs 412 and 413 among the differential pairs 411-414 are $gm_L$', and compared with the transconductance $gm_L$ of the differential pair 414, there is a transconductance difference $$-\Delta gm = \frac{-3}{2}(gm_L - gm_H).$$

$gm_H$ is the transconductance of the first differential pair 411, and $gm_L$ is the transconductance of the fourth differential pair 414.

In the last step S340, the transconductances of the adjustable differential pairs are adjusted according to the adjusted transconductances, so that the output voltage VO can match an expected value when each of a plurality of combinations of the input voltages V1-V4 is received.

The combinations of the input voltages V1-V4 are combinations of a relatively high level input voltage VH and a relatively low level input voltage VL input to the input terminals of the differential pairs 411-414 that do not receive the output voltage. Taking the multi-input operational amplifier 400 illustrated in FIG. 4 as an example, the combinations of the input voltages V1-V4 input to the differential pairs 411-414 may be all or a part of (VH, VH, VH, VH), (VH, VH, VH, VL), (VL, VH, VH, VH), and (VL, VL, VL, VL). The expected value corresponding to each of the combinations of the input voltages V1-V4 is substantially equal to the value listed in foregoing table 1 (i.e., (N×VH+M×VL)/(N+M), wherein N and M are respectively the numbers of the relatively high level input voltage VH and the relatively low level input voltage VL among the input voltages in the combination, and N+M is 4).

It should be noted that in step S340, the transconductances of the adjustable differential pairs can be adjusted by adjusting the width to length ratios (W/L) of the input transistors M421, M422, M431, and M432 in the adjustable differential pairs 412 and 413 or by adjusting the bias currents received by the adjustable differential pairs 412 and 413.

Assuming that the ratio of the transconductance $gm_H$ to the transconductance $gm_L$ is 2:3, the transconductance difference $\Delta gm$ can be obtained as being equal to $gm_L/2$. Namely, in the present example, the transconductance $gm_L$ is adjusted, and the adjusted value is equal to $gm_L/2$.

Thereby, when the differential pairs 412 and 413 are selected to be adjusted, the width to length ratios of the transistors M411-M422 in the differential pairs 412 and 413 can be reduced to a quarter of the original values (i.e., W/(4L)), or the bias currents provided by the bias current generators 422 and 423 can be reduced to a quarter of the original values.

Figure 5:
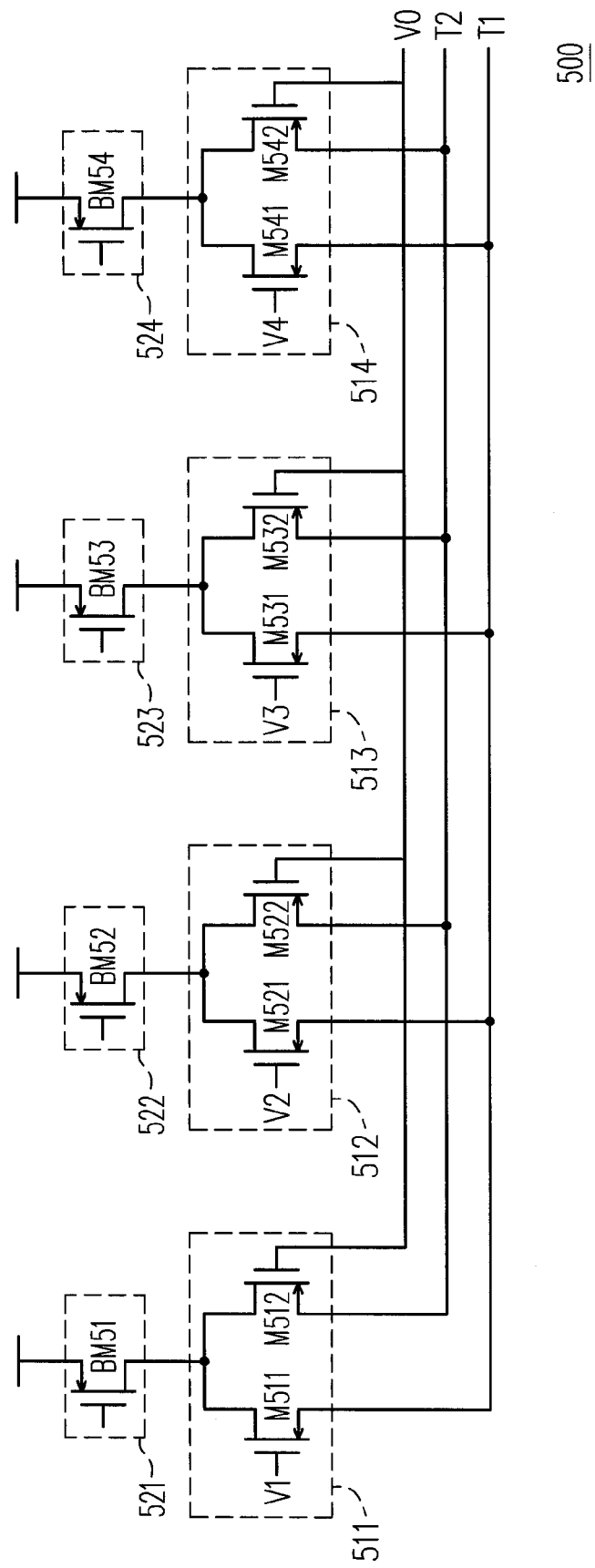
FIG. 5 is a diagram of a multi-input operational amplifier 500 according to yet another embodiment.

FIG. 5 is a diagram of a multi-input operational amplifier 500 according to yet another embodiment. Unlike the differential pairs 411-414 and the bias current generators 421-424 which are respectively composed of N-type transistors M411-M442 and BM41-BM44 in the multi-input operational amplifier 400 described in foregoing embodiment, the differential pairs 511-514 and the bias current generators 521-524 of the multi-input operational amplifier 500 are respectively composed of P-type transistors M511-M542 and BM51-BM54.

It should be noted herein that the output voltage of a multi-input operational amplifier can be compensated through transconductance adjustment regardless of whether the multi-input operational amplifier is composed of N-type transistors, P-type transistors, or both P- and N-type transistors. Accordingly, the output voltage can also be compensated through the procedure illustrated in FIG. 3, and the details of the compensation procedure won't be described again herein.

It should be mentioned that even though the multi-input operational amplifiers 400 and 500 described in foregoing embodiments are 4-input operational amplifiers, the number of inputs of the multi-input operational amplifier is not limited in the invention, and in other embodiments, the technique provided by the invention can be applied to multi-input operational amplifiers having more inputs.

One unique characteristic of foregoing embodiments is that by adjusting the transconductances of specific differential pairs, the transconductance variations of other differential pairs caused by differential voltages can be compensated, and accordingly the output voltage VO can match an expected value. In addition, even though the steps S310-S340 are executed only for a specific combination of the input voltages V1-V4 received by the input terminals of the differential pairs 411-414, the adjusted transconductances allow the output voltage VO to reach an ideal value when different combinations of the input voltages V1-V4 are received.

In summary, in the embodiments, the transconductances of differential pairs when receiving input voltages are obtained, and transconductance differences are calculated according to the transconductances, so as to adjust the transconductances of the differential pairs. Thereby, any error in the output voltage of the multi-input operational amplifier is compensated, and accordingly the accuracy of the output voltage of the multi-input operational amplifier is improved.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An output error compensation method, adapted to a multi-input operational amplifier, wherein the multi-input operational amplifier has a plurality of differential pairs, and each of the differential pairs has a first input terminal coupled to an output terminal of the multi-input operational amplifier and a second input terminal for receiving an input voltage, wherein the input voltage is set at either of a plurality of levels, the output error compensation method comprising:
   regarding a specific combination of the input voltages received by the second input terminals of the differential pairs, executing following steps (i)-(iv):
   (i) obtaining a plurality of original transconductances of the differential pairs;
   (ii) obtaining a plurality of transconductance differences respectively corresponding to a plurality of adjustable differential pairs among the differential pairs according to the original transconductances;
   (iii) obtaining a plurality of adjusted transconductances respectively corresponding to the adjustable differential pairs according to the transconductance differences and the original transconductances; and
   (iv) respectively adjusting transconductances of the adjustable differential pairs according to the adjusted transconductances so that an output voltage matches a respective expected value when each of a plurality of combinations of the input voltages is received.

2. The output error compensation method according to claim 1, wherein a number of the differential pairs is 4, and when each of the combinations is received, the expected value of the input voltage is substantially equal to (NVH+MVL)/(N+M), wherein VH and VL are respectively a high level and a low level among the levels, and N and M are numbers of the input voltages respectively at the high level and the low level.

3. The output error compensation method according to claim 1, wherein the differential pairs comprise a first differential pair, a second differential pair, a third differential pair, and a fourth differential pair, and the specific combination of the input voltages received by the second input terminals of the differential pairs is (VH, VL, VL, VL) or (VH, VH, VH, VL), wherein VH and VL are respectively a high level and a low level among the levels.

4. The output error compensation method according to claim 3, wherein the second differential pair and the third differential pair are the adjustable differential pairs.

5. The output error compensation method according to claim 4, wherein the transconductance differences of the second differential pair and the third differential pair are equal to each other.

6. The output error compensation method according to claim 5, wherein the specific combination is (VH, VL, VL, VL), the transconductance difference of each of the second differential pair and the third differential pair is substantially equal to $$-\Delta gm = \frac{-3}{2}(gm_L - gm_H),$$

and the adjusted transconductances of the second differential pair and the third differential pair are respectively $gm_L - \Delta gm$, wherein $gm_H$ is the original transconductance of the first differential pair when the specific combination is received, and $gm_L$ is the original transconductance of each of the second differential pair, the third differential pair, and the fourth differential pair when the specific combination is received.

7. The output error compensation method according to claim 1, wherein step (iv) comprises:
adjusting width to length ratios (W/L) of a plurality of input transistors in each of the adjustable differential pairs according to the adjusted transconductances of the adjustable differential pairs.

8. The output error compensation method according to claim 1, wherein step (iv) comprises:
adjusting a bias current in each of the adjustable differential pairs according to the adjusted transconductances of the adjustable differential pairs.

9. The output error compensation method according to claim 1, wherein the differential pairs comprise a first differential pair, a second differential pair, a third differential pair, and a fourth differential pair, and the combinations of the input voltages received by the second input terminals of the differential pairs comprise (VH, VH, VH, VH), (VH, VL, VL, VL), (VH, VH, VL, VL), (VH, VH, VH, VL), and (VL, VL, VL, VL).

10. A multi-input operational amplifier, comprising:
a plurality of differential pairs, wherein each of the differential pairs has an input terminal coupled to an output terminal of the multi-input operational amplifier and another input terminal for receiving an input voltage, wherein the input voltage is set at either of a plurality of levels;
wherein the plurality of differential pairs among the differential pairs have adjusted transconductances and have transconductance differences compared to the other differential pairs among the differential pairs when the same input voltages are received, so that an output voltage matches a respective expected value when each of a plurality of combinations of the input voltages of the differential pairs is received.

11. The multi-input operational amplifier according to claim 10, wherein the differential pairs comprise a first differential pair, a second differential pair, a third differential pair, and a fourth differential pair, and a specific combination of the input voltages received by the second input terminals of the differential pairs is (VH, VL, VL, VL) or (VH, VH, VH, VL), wherein VH and VL are respectively a high level and a low level among the levels, and the second differential pair and the third differential pair are the differential pairs.

12. The multi-input operational amplifier according to claim 10, wherein the transconductance differences of the second differential pair and the third differential pair are equal to each other.

13. The multi-input operational amplifier according to claim 12, wherein when the input voltages are (VH, VL, VL, VL), transconductances of the second differential pair and the third differential pair are respectively $gm_L - \Delta gm$, and a transconductance of the fourth differential pair is $gm_L$, wherein $-\Delta gm$ is the transconductance differences of the second differential pair and the third differential pair.

14. The multi-input operational amplifier according to claim 12, wherein $$-\Delta gm = \frac{-3}{2}(gm_L - gm_H),$$

wherein $gm_H$ is a transconductance of the first differential pair.

15. The multi-input operational amplifier according to claim 12, wherein W/Ls of a plurality of input transistors in each of the differential pairs are adjusted according to the transconductance difference of the differential pair.

16. The multi-input operational amplifier according to claim 10, wherein a bias current in each of the differential pairs is adjusted according to the transconductance difference of the differential pair.

17. The multi-input operational amplifier according to claim 10, wherein the differential pairs comprise a first differential pair, a second differential pair, a third differential pair, and a fourth differential pair, and the combinations of the input voltages received by the second input terminals of the differential pairs comprise (VH, VH, VH, VH), (VH, VL, VL, VL), (VH, VH, VL, VL), (VH, VH, VH, VL), and (VL, VL, VL, VL).

* * * * *